United States Patent [19]

Hirata

[11] 4,157,932

[45] Jun. 12, 1979

[54] CONNECTING METHOD

[75] Inventor: Osamu Hirata, Tokyo, Japan

[73] Assignee: Canon Kabushiki Kaisha, Tokyo, Japan

[21] Appl. No.: 845,638

[22] Filed: Oct. 26, 1977

[30] Foreign Application Priority Data

Nov. 4, 1976 [JP] Japan .................................. 5132609

[51] Int. Cl.² .............................................. B32B 7/00
[52] U.S. Cl. ...................................... 156/310; 29/625;
156/334; 156/901; 174/68.5; 252/511; 252/514;
428/1; 428/901
[58] Field of Search ................ 156/182, 334, 310, 901,
156/298, 309; 428/1, 913, 901, 432; 350/330;
252/299, 514, 511, 408 LC; 29/625; 174/68.5

[56] References Cited

U.S. PATENT DOCUMENTS

| 2,543,229 | 2/1951 | Chapman | 428/463 |
|---|---|---|---|
| 2,683,669 | 7/1954 | Coler | 252/511 |
| 2,971,867 | 2/1961 | Lytle | 428/432 |
| 3,003,975 | 10/1961 | Louis | 252/514 |
| 3,026,229 | 3/1962 | Wilcox | 156/309 |
| 3,359,145 | 12/1967 | Salyer et al. | 156/331 |
| 3,382,136 | 5/1968 | Bugel et al. | 428/463 |
| 3,700,547 | 10/1972 | Satterfield et al. | 156/182 |
| 3,764,436 | 10/1973 | Schmidt et al. | 29/625 |
| 3,971,610 | 7/1976 | Buchoff et al. | 174/68.5 |

*Primary Examiner*—John T. Goolkasian
*Assistant Examiner*—J. J. Gallagher
*Attorney, Agent, or Firm*—Fitzpatrick, Cella, Harper & Scinto

[57] ABSTRACT

A method of connecting electrical parts to each other comprises the steps of coating an electroconductive adhesive on the terminal of a first member, coating an insulating adhesive on the terminal of a second member and the surface of the second member in which the terminal is not present, and adhering the first member to the second member with the terminal of the first member being opposite to that of the second member so that the first and second members are adhesively fixed to each other while each terminal of the first and second members are electrically connected.

5 Claims, 2 Drawing Figures

CONNECTING METHOD

BACKGROUND OF THE INVENTION

1. Field of the Invention

The present invention relates to a connecting method and is particularly concerned with a method of connecting electrical parts to each other.

2. Description of the Prior Art

In connecting electrical parts having terminals to each other, a method has been hitherto used which comprises coating selectively an electroconductive adhesive on the terminals of the first electrical part, applying selectively an electrically insulating adhesive onto the surface of the first electrical part in which the terminals are not present, applying the above mentioned two different kinds of adhesives onto the second electrical part in the same manner as above, and opposing the terminals of the first electrical part to those of the second electrical part to connect both electrical parts. Further, another method comprises coating an electroconductive adhesive only on the terminals of the first and second electrical parts to effect the connecting thereof.

However, such hitherto known methods involve disadvantages. The former method has such a disadvantage that it is necessary to coat two different kinds of adhesives on both of the electrical parts. The latter method is disadvantageous that the strength in the connected portion is weak since the adhesive is coated only on the terminals.

SUMMARY OF THE INVENTION

Accordingly, it is an object of the present invention to provide a method of connecting electrical parts to each other which eliminates various disadvantages involved in the prior art.

It is another object of the present invention to provide a method of connecting electrical parts to each other which can be carried out in a short time.

It is a further object of the present invention to provide a method of connecting electrical parts to each other which attains improved strength in the connected portion.

It is a further object of the present invention to provide a connecting method which is suitable for connecting a support board that is damageable at a high temperature, to another electrical part.

It is a further object of the present invention to provide a connecting method which is suitable for connecting an electroconductive pattern to which soldering cannot be applied, to another electrical part.

Other and further objects, features and advantages of the invention will appear more fully from the following description.

According to the present invention, there is provided a method of connecting electrical parts to each other which comprises the steps of coating an electroconductive adhesive on the terminal of a first member, coating an insulating adhesive on the terminal of a second member and the surface of the second member in which the terminal is not present, and adhering the first member to the second member with the terminal of the first member being opposite to that of the second member so that the first and second members are adhesively fixed to each other while each terminal of the first and second members are electrically connected.

DESCRIPTON OF THE PREFERRED EMBODIMENTS

Figure 1:
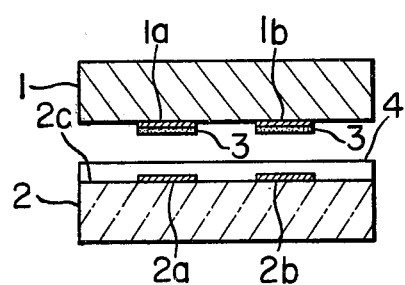
FIG. 1 is an explanatory drawing of the connecting method of the present invention in which a first member will be connected to a second member.
Figure 2:
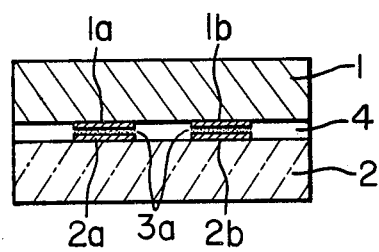
FIG. 2 is an explanatory drawing of the state in which a first member and a second member are connected and fixed to each other in accordance with the present invention.

The present invention will be explained below with reference to the drawings. In FIG. 1, there is shown an embodiment of the present invention in which a first member and a second member will be connected to each other. The reference numeral 1 designates the first member having terminals 1a and 1b, and 2 is the second member having terminals 2a and 2b.

On each of the terminals 1a and 1b of the first member 1, an electroconductive heat fusible adhesive 3 is coated in a form of a layer by using a silk screen, brush or the like and then dried. The electroconductive heat fusible adhesive may be any of those hitherto used, and it may be preferably prepared by dissolving ethylene-vinyl acetate copolymer in a suitable solvent, for example, methyl ethyl ketone, dimethylformamide or the like and further dispersing electroconductive particles of Ag, C or the like in the copolymer solution.

On the other hand, as for the second member 2, an electrically insulating heat fusible adhesive 4 is coated on the whole surface to be connected, that is, the terminals 2a and 2b as well as the surface in which the terminal is not present (this portion is designated by 2c in FIG. 1) in a form of a layer by using a silk screen, roller, brush or the like and dried. The insulating heat fusible adhesive may be any of those hitherto used, and it is preferably ethylene-vinyl acetate copolymer dissolved in a suitable solvent as mentioned above, but in such adhesive, no electroconductive particle is dispersed.

Next, the first and the second members 1 and 2 are brought into contact with each other so that the terminals 1a and 1b of the former member are opposite to the terminals 2a and 2b of the latter member, respectively, as shown in FIG. 1. Heat is applied to the first member and/or the second member in an appropriate manner by a heater. Both members are adhered to each other under pressure so that both of the electroconductive adhesive and the insulating adhesive are united. At that time, the electroconductive particles 3a contained in the electroconductive heat fusible adhesive 3 mix with the insulating heat fusible adhesive 4 so that electrical conduction is established between the terminals 1a and 2a, and the terminals 1b and 2b. After adhesion, air-cooling is effected for several seconds so that the adhesives solidify and both first and second members 1 and 2 are mechanically connected and fixed to each other.

In accordance with the present invention, the adhesion of the first and second members is effected between not only the terminals but also the surfaces of the members where the terminals are not present, and therefore, the adhesion strength in the connected portion is increased markedly. As for the adhesive in which Ag particle is dispersed, migration of Ag can be prevented (by isolating it from external atmosphere) and reliability of the adhesive can be enhanced.

The present invention can be particularly preferably applied to the connecting of a flexible print circuit board and another member, for example, (1) a flexible print circuit board and a hard print circuit board, (2) flexible print circuit boards, and (3) a flexible print circuit board and glass having a vapor-deposited pattern of tin oxide, indium oxide or the like. Further, the connecting of a flexible print circuit board and a liquid crystal display board that is affectible by heat can be also attained advantageously by the present invention.

As the heating method for fixing the members to be connected, a heated iron may be used, and ultrasonic heating and high frequency heating may be also employed. Further, when a liquid crystal display board that is affectible by heat and a flexible print circuit board whose support is thin are connected, a heated iron may be applied from the side of the flexible print circuit board. In addition, when the terminal of the member to be connected is formed from copper, the copper foil pattern may be heated as a heat conductive material.

Other examples of the adhesive used in the present invention are as follows:

(1) Ethylene-acrylic ester copolymer;
(2) ethylene-carboxylic acid copolymer;
(3) ethylene terpolymer; and
(4) phenoyx resin.

As mentioned in the foregoing, two kinds of adhesives, i.e. an electroconductive adhesive and an insulating adhesive are used in the present invention, and an electroconductive adhesive prepared by dispersing an electroconductive particle in the above exemplified adhesive is used as an adhesive for the terminals of one of the two members.

I claim:

1. A method of connecting electrical parts to each other which comprises the steps of:

selectively coating an insulating adhesive composed of a heat fusible material and electroconductive particles dispersed therein on a plurality of terminals of a first member, coating an insulating adhesive uniformly on a plurality of terminals of a second member and the surface of the second member in which the terminals are is not present, and heating under pressure to adhere the first member to the second member with the terminal of the first member being opposite to that of the second member so that the first and second members are adhesively fixed to each other while respective terminals of the first and second members are electrically connected via a mixing of the conductive and insulating adhesives.

2. A method of connecting electrical parts to each other according to claim 1, wherein the first and second member includes a flexible print circuit board.

3. A method of connecting electrical parts to each other according to claim 1, wherein the first and second member includes a hard print circuit board.

4. A method of connecting electrical parts to each other according to claim 1, wherein the first or second member includes glass material having terminal portion formed of a vapor-deposited pattern of tin oxide or indium oxide.

5. A method of connecting electrical parts to each other according to claim 1, wherein the first or second member includes a liquid crystal display board.

* * * * *

UNITED STATES PATENT AND TRADEMARK OFFICE
CERTIFICATE OF CORRECTION

PATENT NO. : 4,157,932
DATED : June 12, 1979
INVENTOR(S) : OSAMU HIRATA

It is certified that error appears in the above-identified patent and that said Letters Patent are hereby corrected as shown below:

On Title Page, [30] Foreign Application Priority

Data, change "5132609" to --51/132609--.

Column 4, line 10, after "terminals are" delete "is".

Signed and Sealed this

Twenty-third Day of October 1979

[SEAL]

Attest:

RUTH C. MASON
*Attesting Officer*

LUTRELLE F. PARKER
*Acting Commissioner of Patents and Trademarks*